United States Patent
Kock et al.

(10) Patent No.: US 8,802,564 B2
(45) Date of Patent: Aug. 12, 2014

(54) METHOD OF MANUFACTURING A SEMICONDUCTOR COMPONENT

(75) Inventors: Mathias Kock, Gokels (DE); Ronald Eisele, Surendorf (DE)

(73) Assignee: Danfoss Silicon Power GmbH, Schleswig (DE)

( * ) Notice: Subject to any disclaimer, the term of this patent is extended or adjusted under 35 U.S.C. 154(b) by 80 days.

(21) Appl. No.: 13/460,939

(22) Filed: May 1, 2012

(65) Prior Publication Data

US 2012/0282772 A1 Nov. 8, 2012

(30) Foreign Application Priority Data

May 3, 2011 (DE) .......................... 10 2011 100 255

(51) Int. Cl.
*H01L 21/44* (2006.01)
(52) U.S. Cl.
USPC .................... 438/669; 257/E21.159; 427/205
(58) Field of Classification Search
CPC ... H01L 21/6838; H01L 21/687; H01L 24/93; H01L 2224/03442; H01L 2224/056
USPC .................. 438/669; 427/205; 257/E21.159; 977/857, 892
See application file for complete search history.

(56) References Cited

U.S. PATENT DOCUMENTS

| | | | | |
|---|---|---|---|---|
| 5,597,110 A | * | 1/1997 | Melton et al. | 228/203 |
| 5,851,911 A | * | 12/1998 | Farnworth | 438/614 |
| 6,603,191 B2 | | 8/2003 | Wakabayashi et al. | |
| 2001/0012643 A1 | * | 8/2001 | Asada | 438/107 |
| 2004/0227251 A1 | | 11/2004 | Yamaguchi | |
| 2006/0244149 A1 | | 11/2006 | Nakamura et al. | |
| 2006/0275949 A1 | * | 12/2006 | Farnworth et al. | 438/106 |
| 2010/0323469 A1 | * | 12/2010 | Borthakur et al. | 438/65 |
| 2013/0084658 A1 | * | 4/2013 | Vaupel et al. | 438/14 |

FOREIGN PATENT DOCUMENTS

DE 10 2006 061 435 A1 6/2008
EP 1 517 597 A2 3/2005

* cited by examiner

*Primary Examiner* — Caridad Everhart
(74) *Attorney, Agent, or Firm* — McCormick, Paulding & Huber LLP

(57) ABSTRACT

A method of manufacturing a semiconductor component includes the steps of manufacturing of a wafer, applying structures of components on the wafer to form a wafer assembly, applying a metal coating on the wafer, removing the metal coating in non-contact areas of the components, applying surrounds on the edge areas of the components, arranging the wafer on a foil held by a clamping ring, separating the components of the wafer compound carried by the foil from one another, arranging a covering mask on the areas of the separated components carried by the foil which are not to be coated, applying a metal coating on the separate components covered with the mask, removal of the mask, and removal of the components from the foil and further processing the separate components wherein that applying a metal coating on the separate components covered by the mask takes place by means of thermal spraying.

1 Claim, 1 Drawing Sheet

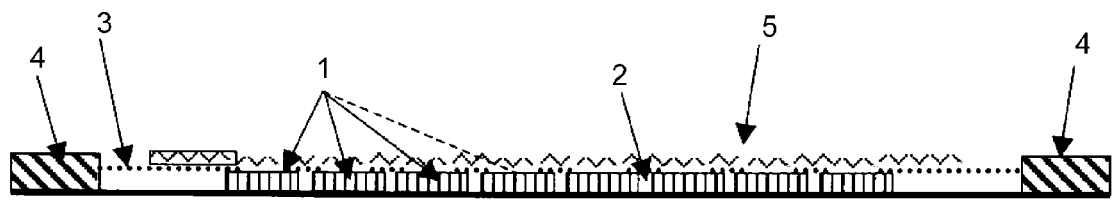

METHOD OF MANUFACTURING A SEMICONDUCTOR COMPONENT

CROSS REFERENCE TO RELATED APPLICATION

Applicants hereby claim foreign priority benefits under U.S.C. §119 from German Patent Application No. 10 2011 100 255.7 filed on May 3, 2011, the contents of which are incorporated by reference herein.

TECHNICAL FIELD

The invention concerns a method of manufacturing a semiconductor component.

BACKGROUND OF THE INVENTION

Such a method is described in U.S. Pat. No. 6,603,191 B2, featuring the application of a metal coating by means of galvanic deposit. When applying the contact layer on the wafer carrying the component, however, it is practically impossible to prevent the wafer from warping due to the galvanic deposit of a metal layer.

SUMMARY OF THE INVENTION

Thus, the invention is based on the task of preventing a warping when applying the contact layer.

According to the invention, this task is solved by means of the features of claim 1 and the single sub-claim defines a preferred embodiment of the invention.

A method of manufacturing a semiconductor component includes the following steps: manufacturing of a wafer, applying structures of components on the wafer to form a wafer assembly, applying a metal coating on the wafer, removing the metal coating in non-contact areas of the components, applying surrounds on the edge areas of the components, arranging the wafer on a foil held by a clamping ring, separating the components of the wafer compound carried by the foil from one another, arranging a covering mask on the areas of the separated components carried by the foil which are not to be coated, applying a metal coating on the separate components covered with the mask, removal of the mask, and removal of the components from the foil and further processing the separate components, wherein applying a metal coating on the separate components covered by the mask takes place by means of thermal spraying. The method of manufacturing a semiconductor component is such that the thermal spraying occurs by means of nano-powder plasma depositing.

BRIEF DESCRIPTION OF THE DRAWING

Further features and advantages of the invention occur from the following description, in which the invention is explained with reference to a drawing:

The single FIGURE shows a wafer arranged on a foil.

DETAILED DESCRIPTION OF THE PREFERRED EMBODIMENTS

The single FIGURE shows the wafer arranged on a foil, the components already being sawn and a metal coating being applied to the contact areas by means of thermal spraying, preferably nano-powder depositing.

Thus, in a manner known per se, the invention suggests manufacturing the wafer by creating the structures of the components and applying passivating surrounds on their edge areas. Subsequently, the wafer is placed on a foil held by a clamping ring, and the components carried by the foil are separated from one another, for example by sawing through the wafer assembly, whilst maintaining the integrity of the foil.

Then, a mask covering the areas of the components that are not to be coated is arranged on the individual components carried by the foil, and a metal coating is applied on the mask by spraying, or, preferably, by means of nano-powder plasma depositing. The mask is then removed and the components are removed from the foil and further processed.

The single FIGURE shows a wafer 2 that is formed by a plurality of components 1 formed by means of, for example, sawing. A mask 3 covers the areas of the separated components 1 which are carried by a foil 4. The FIGURE further shows a metal coating 5 applied on the mask 3 and the contact areas of the components by thermal spraying, or, preferably, by means of nano-powder plasma depositing.

With the suggested method featuring application of the metal coating by means of thermal spraying, a warping of the wafer is prevented.

While the present invention has been illustrated and described with respect to a particular embodiment thereof, it should be appreciated by those of ordinary skill in the art that various modifications to this invention may be made without departing from the spirit and scope of the present.

What is claimed is:

1. A method of manufacturing a semiconductor component by means of the following steps:
   manufacturing of a wafer,
   applying structures of components on the wafer to form a wafer assembly,
   applying a metal coating on the wafer,
   removing the metal coating in non-contact areas of the components,
   applying surrounds on the edge areas of the components,
   arranging the wafer on a foil held by a clamping ring,
   separating the components of the wafer compound carried by the foil from one another,
   arranging a covering mask on the areas of the separated components carried by the foil which are not to be coated,
   applying a metal coating on the separate components covered with the mask,
   removal of the mask, and
   removal of the components from the foil and further processing the separate components,
   wherein applying a metal coating on the separate components covered by the mask takes place by means of thermal spraying, the thermal spraying occurring by means of nano-powder plasma depositing.

* * * * *